United States Patent
Shen et al.

(10) Patent No.: US 6,203,659 B1
(45) Date of Patent: Mar. 20, 2001

(54) METHOD AND APPARATUS FOR CONTROLLING THE QUALITY OF A PHOTORESIST STRIPPER BATH

(75) Inventors: Yun-Hung Shen, Taipei; Pin-Yin Shin, Taichang; Shih-Chun Huang, Hsin-Chu; Yu-Lun Lin, Taipei, all of (TW)

(73) Assignee: Taiwan Semiconductor Manufacturing Company, Ltd., Hsin Chu (TW)

( * ) Notice: Subject to any disclaimer, the term of this patent is extended or adjusted under 35 U.S.C. 154(b) by 0 days.

(21) Appl. No.: 09/280,505

(22) Filed: Mar. 30, 1999

(51) Int. Cl.[7] .................................................... B05C 1/00
(52) U.S. Cl. ........................... 156/345; 216/85; 216/93; 134/111; 134/10
(58) Field of Search ..................................... 134/10, 56 R, 134/110, 111; 216/93, 85; 156/345; 356/72, 434, 436

(56) References Cited

U.S. PATENT DOCUMENTS

| 4,778,532 | * | 10/1988 | McConnell et al. | 134/10 |
| 4,908,676 | * | 3/1990 | Bedell et al. | 356/72 |
| 5,671,760 | * | 9/1997 | Nakagawa et al. | 134/56 R |
| 6,013,156 | * | 1/2000 | Holbrook et al. | 156/345 |

* cited by examiner

Primary Examiner—Thi Dang
(74) Attorney, Agent, or Firm—Tung & Associates

(57) ABSTRACT

A photoresist stripper bath includes a filter in a re-circulation line for filtering residual photoresist materials from said bath. The quality of the stripper and the concentration of the photoresist materials are sensed by passing infrared light transversely through the re-circulating line, detecting the intensity of the light passed through the line and comparing the detected level with a threshold value related to the concentration of the photoresist materials in said stripper.

4 Claims, 2 Drawing Sheets

METHOD AND APPARATUS FOR CONTROLLING THE QUALITY OF A PHOTORESIST STRIPPER BATH

TECHNICAL FIELD

The present invention broadly relates to processes and apparatus for fabricating semiconductor devices, such as wafers, and deals more particularly with a method and apparatus for sensing and controlling the quality of a photoresist stripper bath used to strip photoresist materials applied to the surface of the wafer.

BACKGROUND OF THE INVENTION

In order to fabricate semiconductor devices, such as semiconductor wafers used in integrated circuits, a number of various processes are used to form circuit features and conductive paths on the wafer substrate. One such process involves photolithography wherein a photosensitive material referred to as a photoresist is applied to the face of the substrate, and is subsequently exposed to light through a mask possessing features related to the circuit paths to be formed. Following such exposure, the un-exposed portions of the photoresist, i.e. those covered by the mask, are removed to form the desired conductive paths. The photoresist material is removed by subjecting the exposed photoresist coating to a specialized acid stripper, typically in the form of a bath. The photoresist layer is actually a mixture of a photoresist material combined with a chosen polymer and chemically held together by an organic bond.

As the photoresist stripper bath is used to process successive batches of wafers, the stripped, photoresist material builds up in the stripper bath, thus diluting the concentration of the photoresist stripper acid, and reducing its effectiveness accordingly. In order to solve this problem, the photoresist stripper acid is re-circulated through a filter which filters out the unwanted photoresist materials, thus maintaining the stripper acid above a desired concentration threshold.

In spite of the use of the filtering system mentioned above, the photoresist stripper acid concentration level sometime falls below the desired threshold level for any of a number of reasons, including reduction in the effectiveness of the filter due to residue buildup or other factors, or even complete failure of the filter. In the past, there has been no means by which an operator could be alerted to the fact that the stripper acid concentration had fallen below a threshold level. In other words, there has not previously been a means for monitoring or detecting, on a real time basis, the stripper acid concentration level. As a result, one or more batches of the wafers are not properly processed, thus resulting in defective wafers which in turn reduce throughput and yield in the fabrication process. Accordingly, there is a clear need in the art for a method and apparatus for controlling the quality of a photoresist stripper bath which overcomes each of deficiencies of the prior art mentioned above.

BRIEF DESCRIPTION OF THE INVENTION

According to one aspect of the invention, apparatus is provided for controlling the quality of a liquid photoresist stripper bath wherein the stripper quality is ordinarily degraded by the accumulation of photoresist materials accumulated in the bath. The apparatus includes filter means for filtering the photoresist materials accumulated in the bath, a re-circulating line for delivering the photoresist stripper in the bath to the filter means and for returning the photoresist stripper from the filter means to the bath, and means for sensing the concentration of the photoresist materials present in the bath. The sensing means preferably comprises a source of light energy in a desired range of wavelengths, such as the infrared range (i.e., wavelength=2~15 $\mu$m), and a photosensor for sensing the level of infrared light passing through the photoresist stripper contained in the bath. The infrared light source and infrared detector are preferably mounted on opposite sides of the re-circulating line such that the flow of stripper bath passing through the line is continuously monitored, on a real time basis. The apparatus further includes control means which compares the detected level of infrared light with a threshold level corresponding to a selected concentration level of the photoresist materials contained in the bath.

According to a second aspect of the invention, apparatus is provided for sensing the concentration of photoresist materials contained in a photoresist stripper system of the type including a bath of a photoresist stripper acid used to strip photoresist materials from a semiconductor device during fabrication thereof, a filter for filtering the photoresist materials from the stripper bath and a re-circulating line for delivering the photoresist stripper from the bath to the filter means and for returning the filtered photoresist stripper from the filter means to the bath. The apparatus comprises means for irradiating the stripper with light energy having a wavelength at least partially absorbed by a property of the photoresist materials, and means for detecting the light energy passing through the stripper and originating from the irradiating means, the photoresist material functioning to attenuate the intensity of the light energy passing through the stripper, the intensity of the detected light being related to the concentration of the photoresist material and the stripper.

According to a third aspect of the invention, a method is provided for sensing the concentration of photoresist materials contained in a bath of photoresist stripper used to strip photoresist material from a semiconductor device during fabrication thereof, comprising the steps of: passing the stripper through a line re-circulating the stripper from the bath, back to the bath; passing light energy through a section of the line such that a quantity of the stripper in the line is irradiated with the light energy; and, detecting the light energy passing through the line, the intensity level of the detected light energy being related to the concentration of the photoresist materials contained in the stripper.

The method further includes the steps of comparing the level of intensity detected in step (C) with a threshold value, and issuing an alarm when the level of intensity detected in step (C) falls below the threshold value.

Accordingly, it is a primary object of the present invention to provide real time monitoring and control of the quality of a photoresist stripper acid bath used to fabricate semiconductor devices.

A further object of the invention is to provide a method and apparatus as mentioned above which senses the concentration level of a desired photoresist materials contained in the bath.

A still further object of the invention is to provide a method and apparatus as aforementioned, wherein a relatively simple, inexpensive sensing means is used to sense the concentration of the photoresist materials.

A further object of the invention is to provide a method and apparatus mentioned above which senses the concentration level of photoresist materials contained in the bath without the need for physically contacting the bath or immersing sensors within the bath.

These, and further objects and advantages of the present invention will be made clear or will become apparent during the course of the following description of a preferred embodiment of the invention.

BRIEF DESCRIPTION OF THE DRAWINGS

In the drawings, which form an integral part of the specifications and are to be read in conjunction therewith, along with the appended claims, and wherein like reference numerals are employed to designate identical components in the various views:

DESCRIPTION OF THE PREFERRED EMBODIMENT OF THE INVENTION

Figure 1:
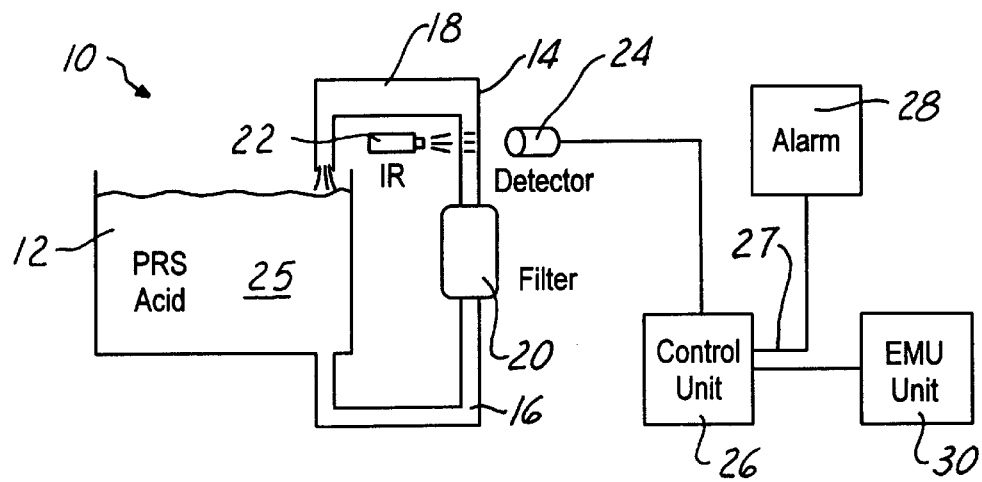
FIG. 1 is a combined block and diagrammatic view of apparatus for controlling the quality of a liquid photoresist stripper acid bath which forms the preferred embodiment of the present invention and is utilized to carry out the inventive method.
Figure 2:
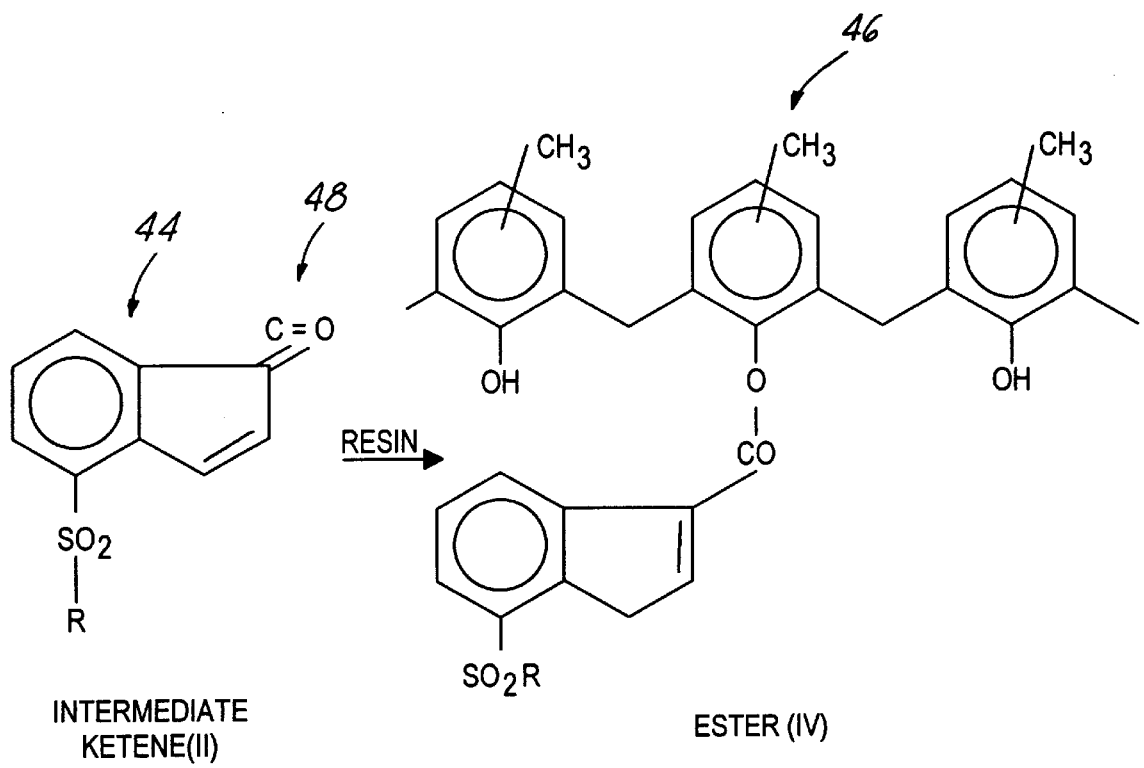
FIG. 2 is a chemical diagram showing the chemical makeup of the photoresist material and polymer mixed therewith which are deposited in the stripper bath shown in FIG. 1; and, FIG. 3 is a block and schematic diagram similar to FIG. 1, but showing the details of one actual implementation of the invention in a photoresist stripper system.

Referring first to FIGS. 1 and 2, the present invention relates to a system generally indicated by the numeral 10 in FIG. 1 for providing real time monitoring of the quality of a photoresist stripper acid 25 contained in a tank 12 which forms a bath. A semiconductor wafer having a layer of exposed photoresist deposited thereon (not shown) is either immersed in the stripper 25, or the stripper 25 is sprayed or otherwise delivered over the surface of the wafer so as to etch or dissolve away the unexposed portions of the photoresist layer.

As shown in FIG. 2, the photoresist material comprises an intermediate ketene (II) indicated by the numeral 44 coupled with an ester (IV) indicated by the numeral 46, by means of an organic bond 48. Continued use of the stripper 25 eventually results in the buildup of concentration of the photoresist materials within the bath 25 which reduces the effectiveness of the bath. The concentration level of the photoresist materials is controlled by passing the stripper 25 through a re-circulating line 14 which causes the stripper 25 to pass through a filter 20 that functions to filter out most of the photoresist material. The re-circulating line 14 includes a first portion coupled with the bottom of the tank 12 which draws off the stripper 25 from the tank 12 that is then driven by a pump (not shown) through the filter 20, and thence through a second section 18 of the line which delivers the filtered stripper back into the tank 12.

In order to sense the concentration level of the photoresist materials in the bath 25, sensing means are provided which comprise a source of light energy 22 that is positioned on one side of the line section 18 so as to direct light energy through the line 18 which is made of a quartz material that is transparent to the chosen form of light energy, i.e., IR light. The light energy passing through the line section 14 thus also passes through the stripper acid flowing through the re-circulating line 14, and the resultant light energy which emerges from the other side of the line section 18 is sensed by a photosensitive detector 24. The light energy produced by the source 22 is preferably matched to a characteristic of the photoresist material. In the illustrated embodiment, the organic bond 48 is absorptive of light energy within the infrared range, consequently light source 22 is preferably an infrared light source producing light having a wavelength in the infrared range. Similarly, the detector 24 is chosen so as to be sensitive to the wavelength of light emitted by the light source 22, and is operative to produce an output signal proportionate to the detected level of light.

In operation, infrared light originating from the source 22 passes through the quartz line section 18, and thus through the stripper flowing therethrough, and the emerging light is sensed by the detector 24. The detector then outputs an average signal value taken during a time period, i.e., 10~20 min to the control unit. The stripper acid (monoethanol amine $H_2NCH_2CH_2Oh$ and dimethyl sulfoxide $(CH_3)_2$ SO) is essentially totally transparent to the infrared light generated by the light source 22, however the organic bond 48 of the photoresist materials absorbs some of the infrared light, with the total absorption and related attenuation of the light from the source 22 being affected and determined by the level of concentration of the photoresist materials contained in the bath 25. Accordingly, the electrical signal output by the detector 24 is related in magnitude to the level of concentration of the photoresist materials contained in the stripper bath 25. The detector signal is delivered to a control unit 26 and compared to a control signal which is obtained completely new acid (without photoresist) which may control various facets of the operation of the system 10, including pumps and the like.

The control unit 26 may comprise a conventional device such as a PLC (Programmable Logic Controller) which has a plurality of inputs, typically in the form of process sensors, and a plurality of outputs for issuing control signals that operate various facets of the system 10. The control unit 26 is also operative to compare the magnitude of the signal output by the detector 24 with a threshold value which represents the maximum tolerable concentration level of photoresist materials contained in the bath 25. If the signal output from detector 24 is less than the threshold value (indicating that the concentration level of the photoresist materials has risen too high) the control unit issues a signal on line 27 to an alarm 28 alerting an operator that corrective action must be taken, such as repairing a pump or changing the filter 20. Additionally, the control unit 26 is operative to output a signal to the electronic make-up unit (EMU) 30 which may selectively add a quantity of fresh stripper acid to the bath, thus decreasing the overall concentration of the photoresist material contained in the bath.

Figure 3:
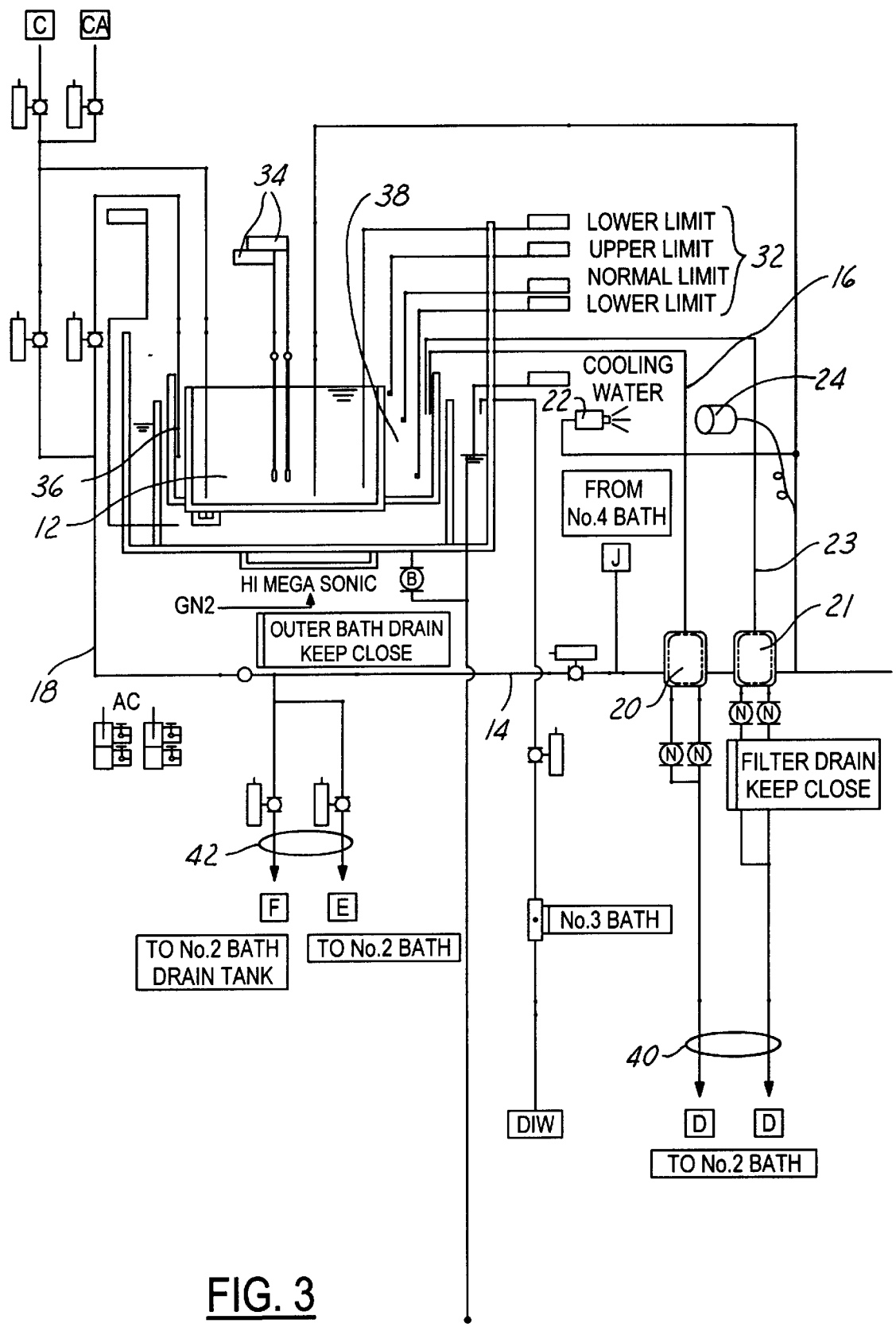

Reference is now made also to FIG. 3 which depicts the details of one actual implementation of the present invention, which is generally similar to FIG. 1 but which depicts details of the wiring and other fixtures of an actual implementation of the present invention. The tank 12, for example, will typically include a pair of temperature probes 34 for sensing the temperature of the bath 25, which temperature is delivered as input signals to the control unit 26. Section 18 of the re-circulating line 14 empties into a well 36 which is in communication with the center of the tank 12 so that returning fluid flows more gently into the central part of the tank 12. Similarly, a second well 38 is provided which is also in communication with the central portion of the tank 12, from which stripper bath fluid is drawn through section 16 of the re-circulating line 14. In addition to the single filter 20, a second filter 21 draws fluid from the tank 12 via a feed line 23. Filter 21 may possess filtering characteristics different from filter 20, e.g. filter 21 may, for example, filter out finer particles of the photoresist materials compared to the filter 20. In any event, stripper fluid passing through filter 21 is then delivered to filter 20, thence through the return section line 18 to the tank 12. The system described above may be connected, for example via lines 40, 42 to a second bath (not shown) which is also provided with a sensing means of the type described above.

From the foregoing, it is apparent that the method and apparatus described above not only provides for the reliable accomplishment of the objects of the invention, but do so in a particularly effective and economical manner. It is recognized, of course, that those skilled in the art may make various modifications or additions chosen to illustrate the invention without departing from the spirit and scope and contribution of the present invention. Accordingly, it is to be understood that the protection sought and to be afforded hereby shall be deemed to extend to the subject matter claimed and all equivalents thereof fairly within the scope of the invention.

What is claimed is:

1. Apparatus for controlling the quality of a bath of photoresist stripper, wherein said stripper quality is degraded by the accumulation of photoresist materials in said bath, comprising:

a tank for containing said bath, said tank having first and second sections divided from each other;

a first filter for filtering photoresist materials accumulated in said bath having a first particle size;

a second filter for filtering photoresist materials accumulated in said bath having a second particle size larger than said first size;

first and second feed lines respectively delivering stripper from said first section of said tank to said first and second filters;

a recirculation line coupling said first and second filters in series with each other and for drawing filtered stripper from said first filter through said second filter, and from said second filter to said second section of said tank;

a light source on one side of said second feed line and oriented to direct light through said second feed line;

a sensor positioned on the opposite side of said second feed line for sensing light passing through said second feed line and originating from said light source, the magnitude of said light sensed by said sensor representing the concentration of said photoresist materials in said bath.

2. The apparatus of claim 1, wherein the wavelength of said light is in the infrared range.

3. The apparatus of claim 2, including means responsive to said sensor for issuing a warning signal when the sensed concentration of said photoresist materials rises above a preselected level.

4. The apparatus of claim 1, wherein said tank includes a third section divided from said first and second sections.

* * * * *